(12) United States Patent
McTigue et al.

(10) Patent No.: US 6,725,172 B2
(45) Date of Patent: Apr. 20, 2004

(54) SYSTEMS AND METHODS FOR TAGGING MEASUREMENT VALUES

(75) Inventors: Michael T. McTigue, Colorado Springs, CO (US); Allen Montijo, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 41 days.

(21) Appl. No.: 10/124,797

(22) Filed: Apr. 17, 2002

(65) Prior Publication Data

US 2003/0200044 A1 Oct. 23, 2003

(51) Int. Cl.[7] .................. G01L 25/00; G01S 13/52; G01S 13/00
(52) U.S. Cl. .................. 702/117; 342/162; 342/195
(58) Field of Search ............... 702/117, 91; 342/160, 342/162, 194, 195, 93

(56) References Cited

U.S. PATENT DOCUMENTS 6,286,061 B1 * 9/2001 Ross ........................... 710/33
6,512,367 B2 * 1/2003 Liu et al. ..................... 324/210

* cited by examiner

*Primary Examiner*—John Barlow
*Assistant Examiner*—Meagan S. Walling

(57) ABSTRACT

Systems and methods for measuring a characteristic of an analog signal are provided. A system for measuring a characteristic of an analog signal includes an analog to digital converter that is configured to convert an analog signal into a digital form that includes at least one digital data value, and logic that is configured to associate a data tag with the data value.

52 Claims, 6 Drawing Sheets

SYSTEMS AND METHODS FOR TAGGING MEASUREMENT VALUES

FIELD OF THE INVENTION

The present invention is generally related to electronic measurement and testing, and more specifically to systems and methods for tagging measurement values.

DESCRIPTION OF THE RELATED ART

There are many types of electronic measurement and testing instruments (MTIs). Such MTIs include oscilloscopes (analog and digital), spectrum analyzers, and logic analyzers, among others. An oscilloscope is a test instrument that displays electronic signals (waves and pulses) on a screen. A typical analog service oscilloscope delivers accuracy within 2 to 5% on both X and Y axes, accommodates low mV to high V inputs, and features time bases that measure from seconds to nanoseconds.

In digital-storage oscilloscopes, signals are digitally coded by an analog-to-digital converter (ADC) into digital bit patterns that are stored in memory. The signals are then retrieved from memory and displayed via a cathode ray tube (CRT) or other display device. A considerable advantage of the digital-storage oscilloscope is its ability to store events prior to triggering so that they can be reproduced and analyzed. Furthermore, any portion of the waveform can be read out motionless, so it can be studied in complete detail.

Logic analyzers, which occupy major roles in debugging hardware and software, usually display waveform timing, digital words in state, and disassembly for microprocessor operations codes. Furthermore, in such instruments, horizontal scales are adjustable, data-point time differences can be measured, and waveform expansion (zooming) is possible.

Spectrum analyzers can tune and detect electronic signals from low frequencies to medium gigahertz (GHz). They can analyze signal content in terms of frequency and can display the result with high accuracy and detail. In addition to oscilloscopes, logic analyzers, and spectrum analyzers, other examples of MTIs include vector analyzers, network analyzers, and mass spectrometers.

An MTI typically includes one or more controllers. If an MTI includes only one controller, then such controller may be required to keep track of all of the data flow in the MTI. In other words the controller must determine the type and location of each data value in the MTI. The complexity of a single controller that keeps track of all of the data flow grows exponentially in relation to the complexity of the MTI. Consequently, a single controller is only used in less complex MTIs.

The more common method for designing an MTI is to include an independent controller for each sub-system within the MTI. Such an arrangement requires a global controller and a consistent set of data-flow rules. Often, the global controller provides "go" or "reset" signals. The data-flow rules dictate the order of data flow, such as, for example, "propagate a single channel 1 data value, followed by a single channel 2 data value, then repeat the process." There are data-flow rules for each processing module and for each mode of operation. For example, in a different mode, the above rule might be changed to "propagate a stream of only channel 1 values."

Multiple controllers within an MTI may not be very difficult to design as long as the number of different operation modes is small. The complexity of such controllers, however, grows exponentially with the number of operation modes and the number of data-flow rules. Furthermore, changes to the operation modes or data-flow rules often necessitate the redesign of a large number of sub-systems to implement any new and/or different rules. For example, assume the designer of a "readout" module decides to change its design such that it repeatedly propagates two channel 1 values followed by two channel 2 values. This design change immediately affects the design requirements for a data splitting module that receives data values (directly or indirectly) from the readout module. As a result, a design change for one MTI module may have complex, time consuming, and risky consequences since it may necessitate the redesign of other MTI modules and since it may be difficult to determine if all of the appropriate modules were correctly modified. Therefore, there exists a need for systems and methods that address these and/or other problems associated with MTIs.

SUMMARY OF THE INVENTION

The present invention provides systems and methods for measuring a characteristic of a device under test (DUT). Briefly described, an embodiment of one such method includes receiving an analog signal from an electronic circuit, converting the analog signal into a digital form that includes at least one digital data value that measures a characteristic of the DUT, and associating a data tag with the data value.

The present invention can also be viewed as providing a system for measuring a characteristic of a DUT. In this regard, an embodiment of one such system includes an analog to digital converter that is configured to convert an analog signal into a digital form that includes at least one digital data value that measures a characteristic of the DUT, and logic that is configured to associate a data tag with the data value.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

Figure 1:
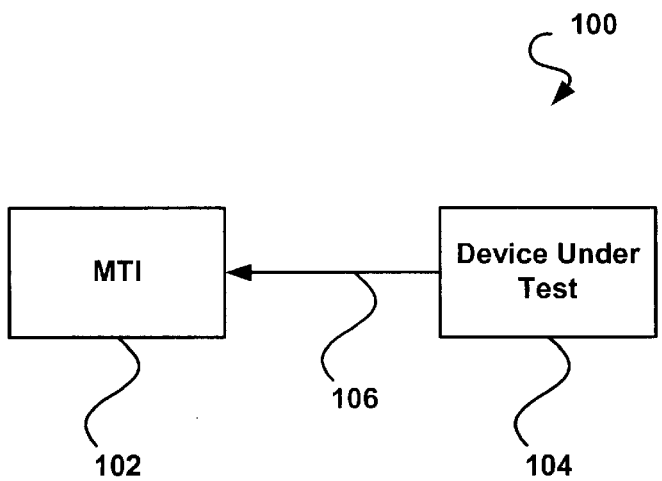
FIG. 1 is a block diagram depicting a measurement system in accordance with one embodiment of the invention.

FIG. 1 is a block diagram depicting a measurement system 100 in accordance with one embodiment of the invention. The measurement system 100 includes a measurement and testing instrument (MTI) 102 and a device under test (DUT) 104. The MTI 102 is configured to measure a characteristic of a signal 106 provided by the DUT 104. The MTI 102 may be, for example, an oscilloscope, a spectrum analyzer, a logic analyzer, a vector analyzer, a network analyzer, or a time interval analyzer. The DUT 104 may be, for example, an electronic device or circuit.

Figure 2:
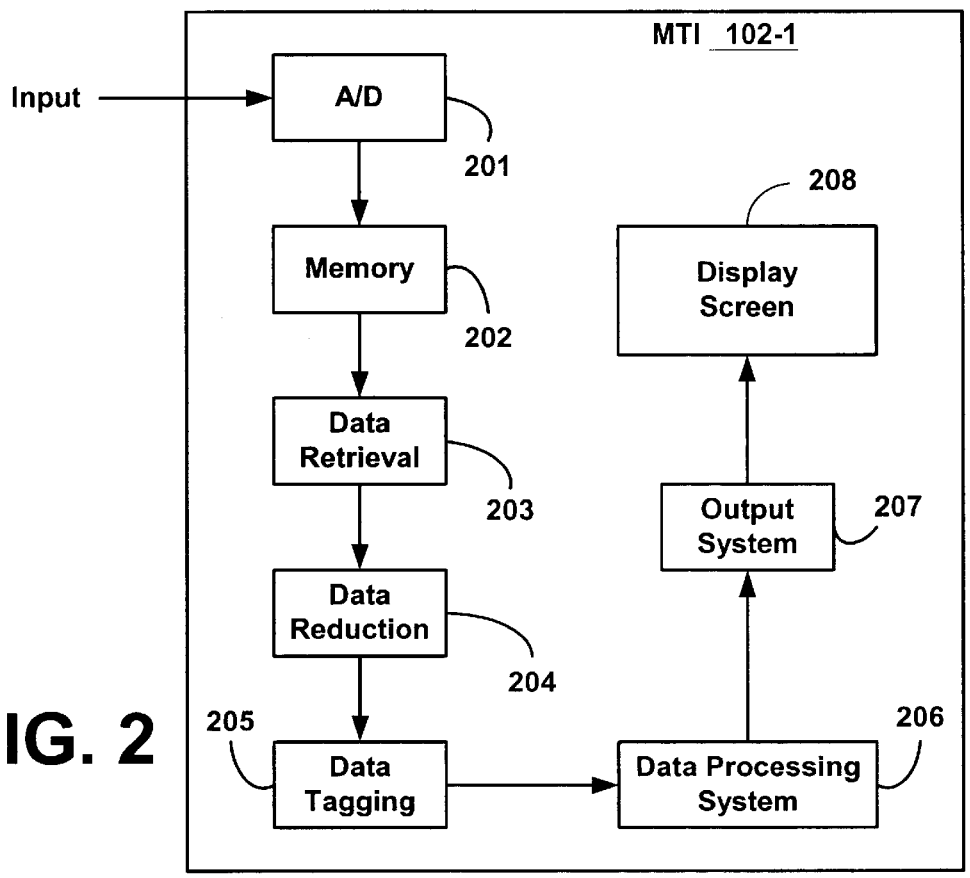
FIG. 2 is a block diagram depicting one embodiment of a measurement and testing instrument (MTI) shown in FIG. 1.

FIG. 2 is a block diagram of an MTI 102-1 in accordance with one embodiment of the present invention. The MTI 102-1 may be, for example, an oscilloscope or a spectrum analyzer, among others. An analog to digital (A/D) converter 201 of the MTI 102-1 receives an analog input signal and converts it into a sequence of digital data values. The A/D converter 201 forwards the digital data values to a memory module 202 where they are stored. A data retrieval module 203 retrieves data values from the memory module 202 and forwards them to a data reduction module 204. The data reduction module 204 reduces the number of data values via, for example, decimation and forwards the reduced data values to a data tagging module 205. The data reduction module 204 may include, for example, a peak detect circuit for detecting peak values and/or a decimator circuit for decimating the data. The data tagging module 205 attaches data tags to the data values received from the data reduction module 204. Each data tag may comprise one or more bits and may be used to identify one or more characteristics of a respective data value. After a data value is tagged by the data tagging module 205, it is forwarded to a data processing system 206 which performs zero or more data processing steps on the data value and then forwards the processed data value to the output system 207. For example, the data processing system 206 may perform correction of peak values and/or data filtering. Therefore, a data value that is output by the data processing system 206 may be a modified version of a data value that is received by the data processing system 206 from the data tagging module 205. Data values forwarded to output system 207 drive a display screen 208. The display screen 208 displays a video image depicting one or more input signals that are received by the MTI 102-1. The video image may be used to ascertain one or more characteristics (e.g., amplitude, phase, and/or frequency) of the input signal(s). Note that the data values may not necessarily be used to drive a display screen 208. For example, a user may import the data value into another application whereby the data values can be further manipulated. In an alternative implementation, data values may be tagged prior to being stored in the memory module 202. In yet another implementation, an MTI may not include the memory module 202, and the data values are therefore not stored in memory.

Figure 3:
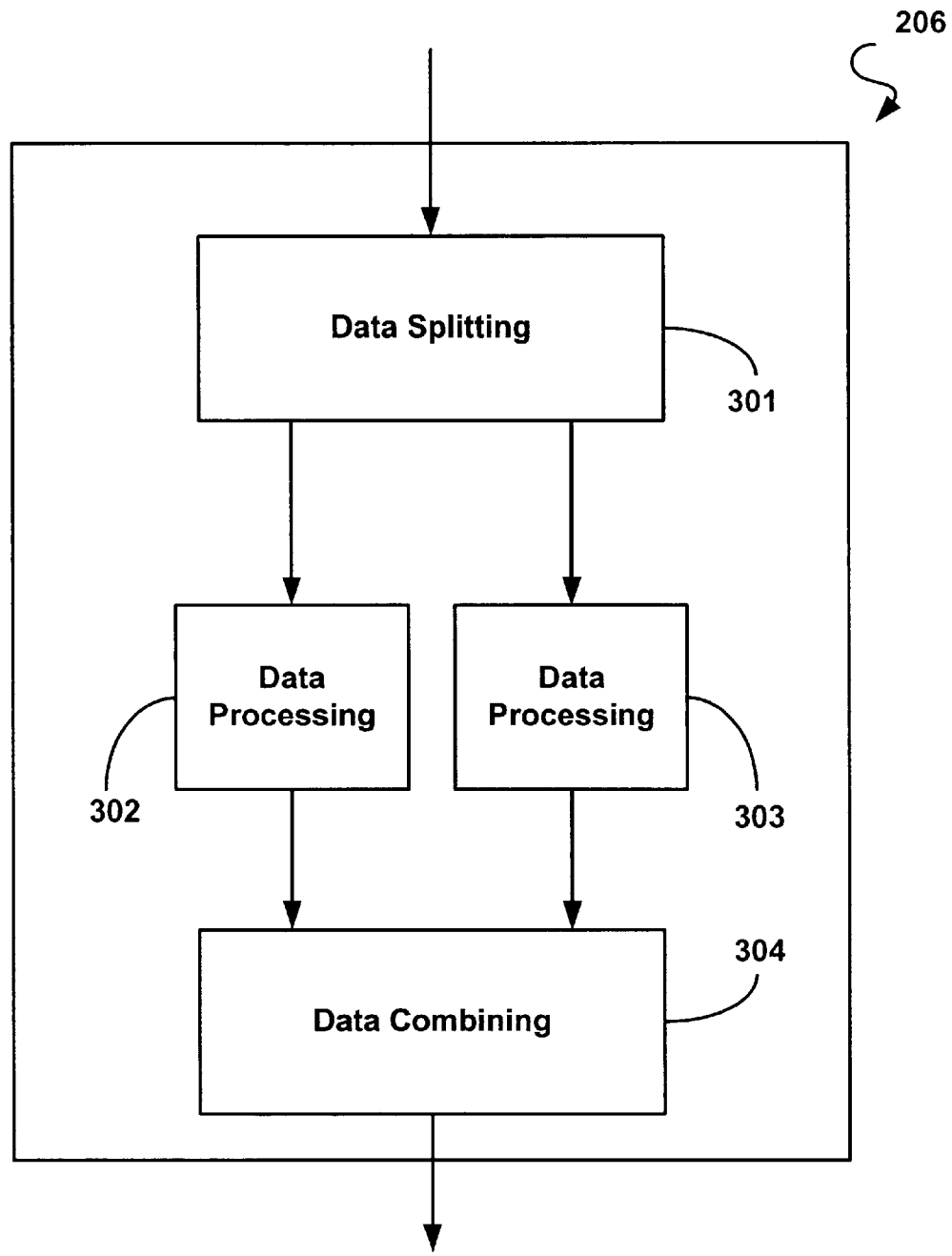
FIG. 3 is a block diagram depicting selected components of a data processing system depicted in FIG. 2.

FIG. 3 is a block diagram depicting selected components of a data processing system 206 (FIG. 2) in accordance with one embodiment of the present invention. The data processing system 206 comprises a data splitting module 301 that receives data values from a data tagging module (FIG. 2). The data splitting module 301 forwards each data value to data processing modules 302 and 303 based on a data tag that is attached to the data value. For example, a data tag may indicate the input channel to which a data value corresponds. In this manner, a data value that corresponds to a first input channel may be forwarded to a first data processing module 302 and a data value that corresponds to a second input channel may be forwarded to a second data processing module 303. Each data processing module 302 or 303 may perform a specific function in relation to data values received from the data splitting module 301. For example, a data processing module 302 or 303 may filter the data, correct erroneous minimum or maximum peak values, and/or calculate statistical attributes of the data. The data processing modules 302 and 303 forward processed data values to a data combining module 304. The data combining module 304 combines the processed data values and forwards them to the output system 207 (FIG. 2).

Figure 4:
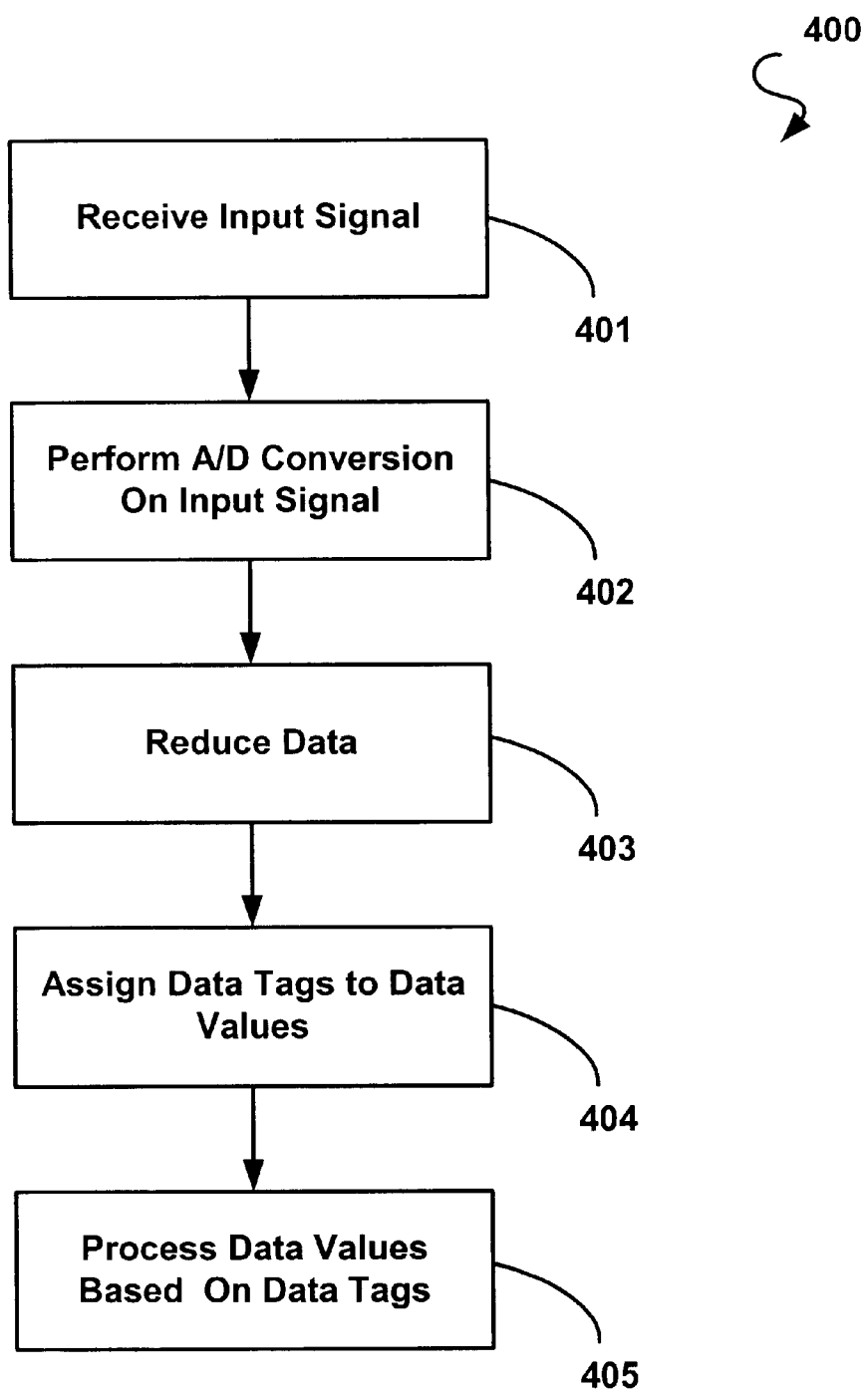
FIG. 4 is a flow chart depicting a measurement method that is implemented by the MTI depicted in FIG. 1.

FIG. 4 is a flow chart depicting a measurement method 400. The method 400 may be implemented via an electronic MTI 102 (FIG.1). In step 401, an analog input signal is received from a device under test (DUT) for which a voltage or current is to be determined, analyzed or tested. The input signal may be received via a probe that is in contact with a certain portion of the DUT. After the analog input signal is received, it is converted into a sequence of digital data values via an analog to digital (A/D) conversion process, as indicated in step 402.

Subsequently, the data values may be (optionally) reduced in step 403 via, for example, a decimation and/or peak detection process, among others. A decimation process may extract one data value out of every n data values and discards the rest. A peak detection process may evaluate every data value and may maintain the minimum and maximum values for a given decimation period. After the data values are reduced, data tags are attached to the remaining data values, as indicated in step 404. Each data tag identifies one or more characteristics of a respective data value. A characteristic of a data value may be, for example, among others, the level of the data value (e.g., Min or Max), how the data value had been processed (e.g., whether it was decimated), and the source of the data value (e.g., channel 1 or channel 2). Attaching data tags to the data values allows additional processing to be performed to the data values in step 405 based on their respective data tags. As a non-limiting example, a data value having the data tag 001 may be processed differently from a data value having the data tag 010. The additional processing may include, for example, data splitting, correcting minimum and maximum values, filtering, accumulating statistics, and/or data combining, among others.

Processing data values based on their respective data tags allows modules to be "de-coupled" from a design standpoint and thus simplifies the design of the modules' respective controllers. Each module's controller is designed to determine what to do with the different types of data that it encounters. For example, a data splitting module simply examines a data tag to determine where to send a corresponding data value. It is not affected by the order in which data values arrive; it simply examines the data tags and acts accordingly. In this manner, the designer of, for example, a readout module that provides data values (directly or indirectly) to the data splitting module can change the order of the data flow without necessitating the redesign of the data splitting module. Therefore, by allowing a change to one module without requiring changes to other modules, data tagging can make the design of an MTI easier, less time consuming, and less risky.

Figure 5:
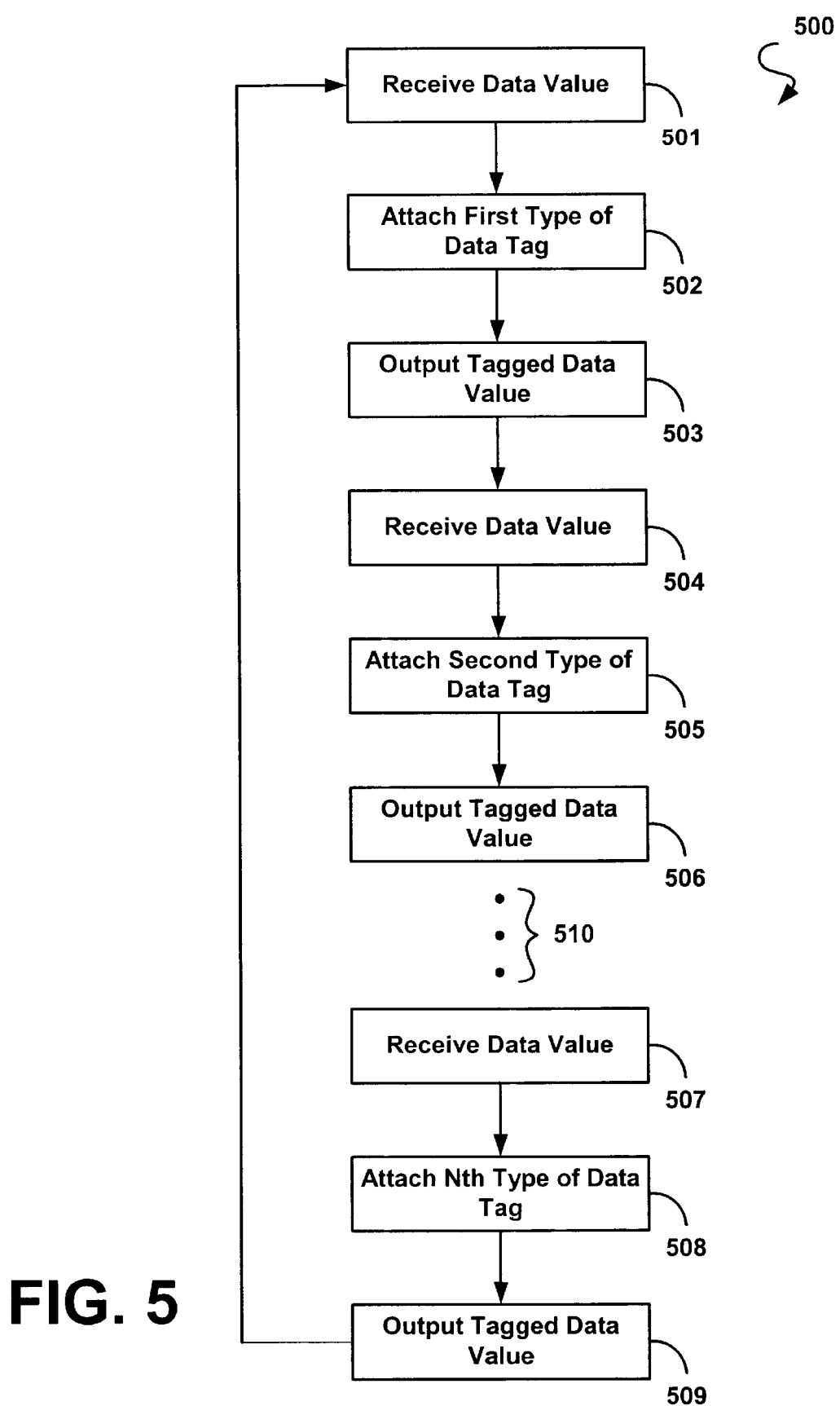
FIG. 5 is a flow chart depicting one embodiment of a data tagging method that is used in the measurement method illustrated in FIG. 4.

FIG. 5 is a flow chart depicting a data tagging method 500 that may be implemented by a tagging system. The data tagging method 500 may be used where types of data values are received by the tagging system in a deterministic and predictable cyclical order. As a non-limiting example, the method 500 may be used if data values corresponding to a minimum peak value ("Min"), a maximum peak value ("Max"), and a decimated data value are received in the following cyclical order: Min, Max, decimated, Min, Max, decimated, Min, Max, decimated, etc.

In step 501 of the data tagging method 500, a data value is received. Subsequently, in step 502, a first type of data tag is attached to the received data value (i.e., the data value is "tagged"). As a non-limiting example, the first type of data tag may comprise the bit sequence "001" and may be used to indicate that the data value to which it is attached is a minimum peak value. After the data value is tagged it is output by the data tagging system in step 503. Another data value is received in step 504 and a second type of data tag is attached to this data value in step 505. For example, the second type of data tag may comprise the bit sequence "010" and may be used to indicate that the data value to which it is attached is a maximum peak value. After the data value is tagged it is output by the data tagging system in step 506.

Additional data values may be received and then tagged using additional types of data tags as indicated by the ellipsis 510. After a data value is received in step 507, is tagged in step 508 using an Nth type of data tag, and is output by the data tagging system in step 509, the method returns to step 501. Steps 501–509 are then repeated until the desired data is tagged or until the method is terminated.

It should be noted that each data tag could be used to identify more than one characteristic of a data value. As a non-limiting example, the data tag "001" may be used to indicated that a data value is a minimum peak value that corresponds to an input signal received via a first input channel, whereas the data tag "110" may be used to indicate that a data value is a maximum peak value that corresponds to an input signal received via a second input channel.

The data tagging method 500 may be implemented using two or more types of data tags. If three types of data tags are used, then the method 500 may be implemented such that the Nth type of data tag used in step 508 corresponds to a third type of data tag. As a non-limiting example, if Min, Max, and decimated values are received, then the method 500 may be implemented as follows:

1) Step 501—Receive Min;
2) Step 502—Attach 001 to Min;
3) Step 503—Output Tagged Min;
4) Step 504—Receive Max;
5) Step 505—Attach 010 to Max;
6) Step 506—Output Tagged Max;
7) Step 507—Receive decimated value;
8) Step 508—Attach 011 to decimated value;
9) Step 509—Output Tagged decimated value;
10) Step 501—Receive Min;
11) Step 502—Attach 001 to Min;
12) Step 503—Output Tagged Min;
13) Step 504—Receive Max;
14) Step 505—Attach 010 to Max;
15) Step 506—Output Tagged Max;
16) Step 507—Receive decimated value;
17) Step 508—Attach 011 to decimated value;
18) Step 509—Output Tagged decimated value; etc.

If, however, only two types of data tags are used, then steps 501–506 may be implemented in a cyclical repeated manner and steps 507–509 may be eliminated. As a non-limiting example, if only Min and Max values are received, then the method 500 may be implemented as follows:

1) Step 501—Receive Min;
2) Step 502—Attach 001 to Min;
3) Step 503—Output Tagged Min;
4) Step 504—Receive Max;
5) Step 505—Attach 010 to Max;
6) Step 506—Output Tagged Max;
7) Step 501—Receive Min;
8) Step 502—Attach 001 to Min;
9) Step 503—Output Tagged Min;
10) Step 504—Receive Max;
11) Step 505—Attach 010 to Max;
12) Step 506—Output Tagged Max; etc.

Furthermore, the method 500 may be modified such that one type of data tag is assigned to two or more data values that are received in succession. For example, two decimated values may be received consecutively and may be tagged with similar data tags as illustrated in the following cyclical sequence:

1) Step 501—Receive Min;
2) Step 502—Attach 001 to Min;
3) Step 503—Output Tagged Min;
4) Step 504—Receive Max;
5) Step 505—Attach 010 to Max;
6) Step 506—Output Tagged Max;
7) Step 507—Receive decimated value;
8) Step 508—Attach 011 to decimated value;
9) Step 509—Output Tagged decimated value;
10) Step 507—Receive decimated value;
11) Step 508—Attach 011 to decimated value;
12) Step 509—Output Tagged decimated value;
13) Step 501—Receive Min;
14) Step 502—Attach 001 to Min;
15) Step 503—Output Tagged Min;
16) Step 504—Receive Max;
17) Step 505—Attach 010 to Max;
18) Step 506—Output Tagged Max;
19) Step 507—Receive decimated value;
20) Step 508—Attach 011 to decimated value;
21) Step 509—Output Tagged decimated value;
22) Step 507—Receive decimated value;
23) Step 508—Attach 011 to decimated value;
24) Step 509—Output Tagged decimated value; etc.

Figure 6:
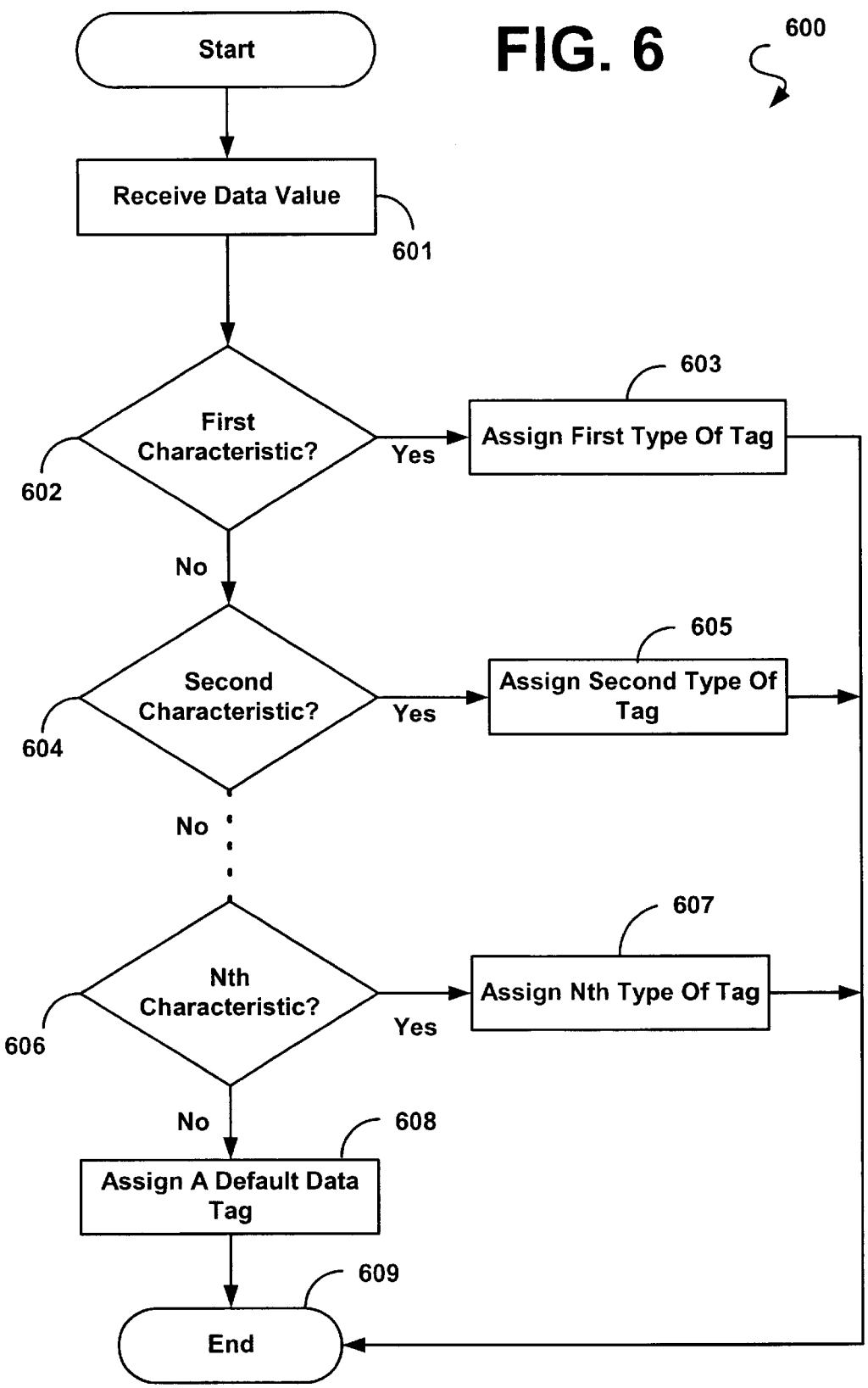
FIG. 6 is a flow chart depicting another embodiment of the data tagging method that is used in the measurement method illustrated in FIG. 4.

FIG. 6 is a flow chart depicting a data tagging method 600 that may be implemented by a tagging system. The data tagging method 600 may be used where types of data values are received by the tagging system in a random order. In step 601 of the data tagging method 600, a data value is received. Subsequently, in step 602, a determination is made as to whether the received data value has a first characteristic. A characteristic of a data value may be, for example, among others, the level of the data value (e.g., Min or Max), how the data value had been processed (e.g., whether it was decimated), and the source of the data value (e.g., channel 1 or channel 2).

If the data value has a first characteristic, then a first type of data tag is attached to the data value, as indicated in step 603. A type of data tag may comprise a single bit (e.g., 1 or 0) or a certain sequence of bits. However, if the data value does not have the first characteristic, then a determination is made in step 604 as to whether the received data value has a second characteristic. If the data value has a second characteristic, then a second type of data tag is attached to the data value, as indicated in step 605. This process of determining a data type and attaching a data tag if applicable, may continue until a determination is made in step 606 as to whether the data value has an Nth characteristic. If the data value is an Nth type of data value, then Nth type of data tag is attached to it in step 607. If the data value is not an Nth type of data value, then a default data tag is attached to the data value in step 608, and the method 600 terminates as indicated in step 609. The method 600 may be repeated until a desired number of data values are tagged.

The blocks or steps depicted in the FIGS. 5 and 6 may be executed out of order from that shown or discussed, including substantially concurrently or in reverse order, depending on the functionality involved, as would be understood by those reasonably skilled in the art. Also note that different segments of a data tag may be determined by different methods, either sequentially or in parallel. For example, a data value may be assigned a first data tag segment 01 via method 500 (FIG. 5) and a second data tag segment 10 via method 600 (FIG. 6) such that the data value is assigned the data tag 0110. It will also be appreciated by those reasonably skilled in the art that the functionality provided by each of the methods illustrated in FIGS. 5 and 6, can be implemented through software and/or hardware. An example of a hardware implementation is an application specific integrated circuit (ASIC) and supporting circuitry. Furthermore, the functionality provided by each of the methods illustrated in FIGS. 5 and 6 can be embodied in any computer-readable medium for use by or in connection with a computer-related system or method. In the context of this document, a computer-readable medium is an electronic, magnetic, optical, semiconductor, or other physical device or means that can contain or store a computer program or data for use by or in connection with a computer-related system or method.

Figure 7:
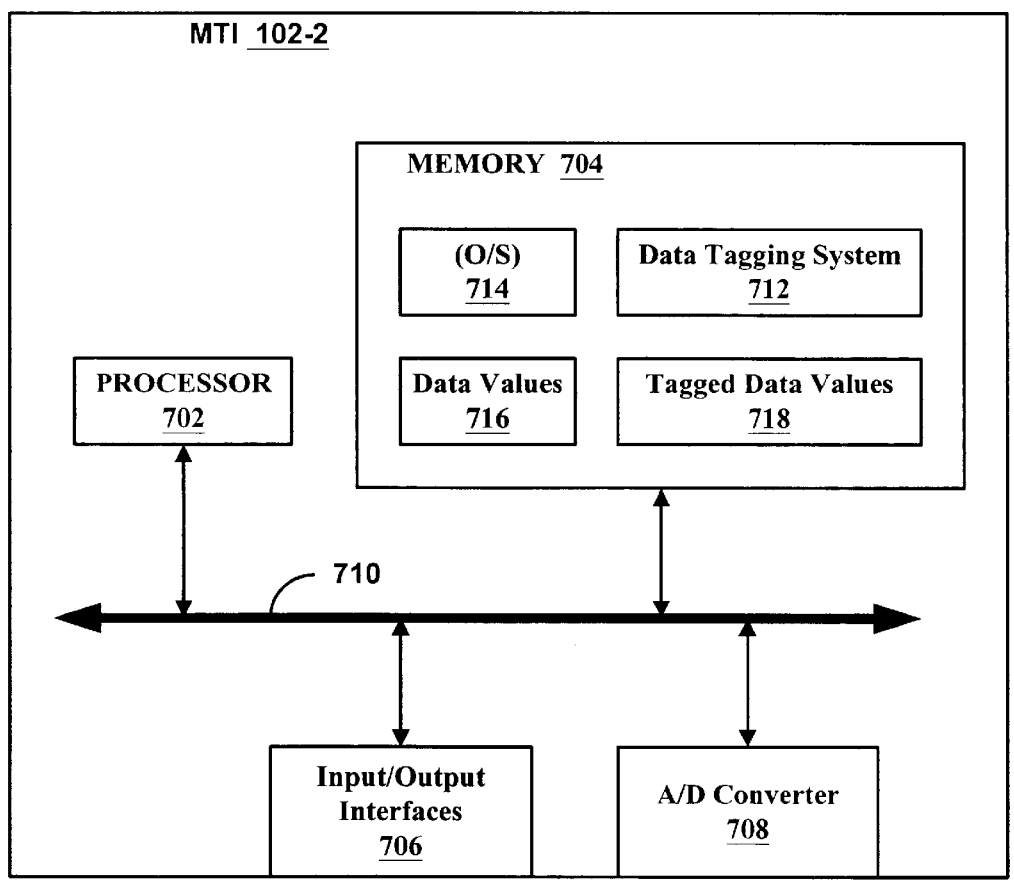
FIG. 7 is a block diagram depicting another embodiment of the MTI shown in FIG. 1.

FIG. 7 is a block diagram depicting a non-limiting example of an MTI 102-2 that can be used to implement an embodiment of the present invention. The MTI 102-2 may be a special or general purpose digital computer, such as a personal computer (PC; IBM-compatible, Apple-compatible, or otherwise), a workstation, a minicomputer, or a mainframe computer. Generally, in terms of hardware architecture, as shown in FIG. 7, the MTI 102-2 includes a processor 702, memory 704, input/output (I/O) interfaces 706, and an A/D converter 708. These components (702, 704, 706, and 708) are communicatively coupled via a local interface 710. The local interface 710 can be, for example but not limited to, one or more buses or other wired or wireless connections.

The processor 702 is a hardware device for executing software or firmware, particularly that stored in memory 704. When the MTI 102-2 is in operation, the processor 702 is configured to execute software stored within the memory 704, to communicate data to and from the memory 704, and to generally control operations of the MTI 102-2 pursuant to the software.

The I/O interfaces 706 may be used to receive user input and/or to provide system output via one or more devices or components. User input may be provided via, for example, a keyboard and/or a mouse. System output may be provided via a video monitor and/or a printer 101. Communication interfaces 706 may include, for example, a serial port, a parallel port, a Small Computer System Interface (SCSI), an IR interface, an RF interface, and/or a universal serial bus (USB) interface, among others. An analog signal that is to be measured may be received via the analog-to-digital (A/D) converter 708 and converted into digital data values 716 that are subsequently stored in memory 704.

The memory 704 can include any one or combination of volatile memory elements (e.g., random access memory (RAM, such as DRAM, SRAM, SDRAM, etc.)) and non-volatile memory elements (e.g., ROM, hard drive, tape, CDROM, NVRAM, etc.). Moreover, the memory 704 may incorporate electronic, magnetic, optical, and/or other types of storage media. Note that the memory 704 can have a distributed architecture, where various components are situated remote from one another, but can be accessed by the processor 702.

The software in memory 704 may include one or more separate programs, each of which comprises an ordered listing of executable instructions for implementing logical functions. In the example of FIG. 7, the software in the memory 704 includes a data tagging system 712, and a suitable operating system (O/S) 714. The data tagging system 712 may be a source program, an executable program (object code), a script, or any other entity comprising a set of instructions to be performed. The data tagging system 712 attaches data tags to the data values 716 to produce tagged data values 718 that are stored in memory 704. In one embodiment, the data tagging system 712 uses the tagging method 600 illustrated in FIG. 6. The operating system 714 essentially controls the execution of other computer programs, such as the data tagging system 712, and provides scheduling, input-output control, file and data management, memory management, and communication control and related services.

When the data tagging system 712 is implemented in software, as is shown in FIG. 7, it may be stored on any computer readable medium for use by or in connection with any computer related system or method. In the context of this document, a computer readable medium is an electronic, magnetic, optical, or other physical device or means that can contain or store a computer program for use by or in connection with a computer related system or method.

In an alternative embodiment, the data tagging system 712 may be implemented in hardware using, for example, any or a combination of the following technologies which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A method for measuring a characteristic of a device under test (DUT), the method comprising:

receiving an analog signal from the DUT;

converting the analog signal into a digital form that includes at least one digital data value that measures a characteristic of the DUL; and associating a data tag with the data value, wherein the data tag identifies one or more characteristics of the data value;

wherein at least one of the receiving, converting, and associating is implemented with a member of a group consisting of:

an oscilloscope, a spectrum analyzer, a logic analyzer, a vector analyzer, a network analyzer, and a time interval analyzer.

2. The method of claim 1, further comprising:
storing the data value in memory.

3. The method of claim 2, further comprising:
displaying a graph that includes a point that represents the data value.

4. The method of claim 1, wherein the characteristic of the analog signal is a voltage level.

5. The method of claim 4, further comprising:
displaying a graph that includes a point that represents the data value.

6. The method of claim 1, wherein the characteristic of the analog signal is a current level.

7. The method of claim 6, further comprising:
displaying a graph that includes a point that represents the data value.

8. The method of claim 1, further comprising:
associating a plurality of data tags with a plurality of data values included in the digital form of the analog signal, wherein each data tag identifies a characteristic of a respective data value.

9. The method of claim 8, further comprising:
displaying a graph that includes a point that represents the data value.

10. The method of claim 1, further comprising:
displaying a graph that includes a point that represents the data value.

11. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and filtering the data value based on a value of the data tag.

12. The method of claim 11, wherein the method is implemented with a member of a group consisting of:

an oscilloscope, a spectrum analyzer, a logic analyzer, a vector analyzer, a network analyzer, and a time interval analyzer.

13. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and modifying the data value based on a value of the data tag.

14. The method of claim 13, further comprising:
displaying a graph that includes a point that represents the data value.

15. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and routing the data value based on a value of the data tag.

16. The method of claim 15, wherein the method is implemented with a member of a group consisting of:

an oscilloscope, a spectrum analyzer, a logic analyzer, a vector analyzer, a network analyzer, and a time interval analyzer.

17. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and displaying a graph that includes a point that represents the data value.

18. The method of claim 17 wherein the method is implemented with a member of a group consisting of:

an oscilloscope, a spectrum analyzer, a logic analyzer, a vector analyzer, a network analyzer, and a time interval analyzer.

19. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and determining whether the data value is a peak value.

20. The method of claim 19, wherein the method is implemented with a member of a group consisting of:

an oscilloscope, a spectrum analyzer, a logic analyzer, a vector analyzer, a network analyzer, and a time interval analyzer.

21. A method for measuring a characteristic of a device under test (DUT), the method comprising:

receiving an analog signal from the DUT;

converting the analog signal into a digital form that includes at least one digital data value that measures a characteristic of the DUT;

associating a data tag with the data value, wherein the data tag identifies one or more characteristics of the data value; and accumulating statistical information based on a value of the data tag.

22. The method of claim 21, wherein the method is implemented with a member of a group consisting of:

an oscilloscope, a spectrum analyzer, a logic analyzer, a vector analyzer, a network analyzer, and a time interval analyzer.

23. A method for measuring a characteristic of a device under test (DUT), the method comprising:
- receiving an analog signal from the DUT;
- converting the analog signal into a digital form that includes at least one digital data value that measures a characteristic of the DUT;
- associating a data tag with the data value, wherein the data tag identifies one or more characteristics of the data value; and
- decimating a plurality of data values that include the data value.

24. The method of claim 23, further comprising:
- displaying a graph that includes a point that represents the data value.

25. A method for measuring a characteristic of a device under test (DUT), the method comprising:
- receiving an analog signal from the DUT;
- converting the analog signal into a digital form that includes at least one digital data value that measures a characteristic of the DUT; and
- associating a data tag with the data value, wherein the data tag identifies one or more characteristics of the data value;
- wherein the characteristic of the analog signal is one of a light level, a frequency, a phase, a time interval, and a vector.

26. The method of claim 25, wherein the method is implemented with a member of a group consisting of:
- an oscilloscope, a spectrum analyzer, a logic analyzer, a vector analyzer, a network analyzer, and a time interval analyzer.

27. A method for measuring a characteristic of a device under test (DUT), the method comprising:
- receiving an analog signal from the DUT;
- converting the analog signal into a digital form that includes at least one digital data value that measures a characteristic of the DUT; and
- associating a data tag with the data value, wherein the data tag identifies one or more characteristics of the data value;
- wherein the data tag identifies an input channel for the analog signal.

28. The method of claim 27, wherein the method is implemented with a member of a group consisting of:
- an oscilloscope, a spectrum analyzer, a logic analyzer, a vector analyzer, a network analyzer, and a time interval analyzer.

29. A method for measuring a characteristic of a device under test (DUT), the method comprising:
- receiving an analog signal from the DUT;
- converting the analog signal into a digital form that includes at least one digital data value that measures a characteristic of the DUT; and
- associating a data tag with the data value, wherein the data tag identifies one or more characteristics of the data value;
- wherein the data tag identifies whether the data value is a peak value.

30. The method of claim 29, further comprising:
- displaying a graph that includes a point that represents the data value.

31. A method for measuring a characteristic of a device under test (DUT), the method comprising:
- receiving an analog signal from the DUT;
- converting the analog signal into a digital form that includes at least one digital data value that measures a characteristic of the DUT; and
- associating a data tag with the data value, wherein the data tag identifies one or more characteristics of the data value;
- wherein the data tag identifies whether the data value is a decimated data value.

32. The method of claim 31, wherein the method is implemented with a member of a group consisting of:
- an oscilloscope, a spectrum analyzer, a logic analyzer, a vector analyzer, a network analyzer, and a time interval analyzer.

33. A method for testing a device under test (DUT), comprising:
- receiving a data value that measures a characteristic of an analog signal;
- associating a data tag with the data value, wherein the data tag identifies one or more characteristics of the data value; and
- filtering the data value based on a value of the data tag.

34. The method of claim 33, wherein the method is implemented with a member of a group consisting of:
- an oscilloscope, a spectrum analyzer, a logic analyzer, a vector analyzer, a network analyzer, and a time interval analyzer.

35. A method for testing a device under test (DUT), comprising:
- receiving a data value that measures a characteristic of an analog signal;
- associating a data tag with the data value, wherein the data tag identifies one or more characteristics of the data value; and
- modifying the data value based on a value of the data tag.

36. The method of claim 35, further comprising:
- displaying a graph that includes a point that represents the data value.

37. A method for testing a device under test (DUT), comprising:
- receiving a data value that measures a characteristic of an analog signal;
- associating a data tag with the data value, wherein the data tag identifies one or more characteristics of the data value; and
- routing the data value based on a value of the data tag.

38. The method of claim 37, wherein the method is implemented with a member of a group consisting of:
- an oscilloscope, a spectrum analyzer, a logic analyzer, a vector analyzer, a network analyzer, and a time interval analyzer.

39. A method for testing a device under test (DUT), comprising:
- receiving a data value that measures a characteristic of an analog signal;
- associating a data tag with the data value, wherein the data tag identifies one or more characteristics of the data value; and
- displaying a graph that includes a point that represents the data value.

40. The method of claim 39, wherein the method is implemented with a member of a group consisting of:
- an oscilloscope, a spectrum analyzer, a logic analyzer, a vector analyzer, a network analyzer, and a time interval analyzer.

41. A method for testing a device under test (DUT), comprising:

receiving a data value that measures a characteristic of an analog signal;

associating a data tag with the data value, wherein the data tag identifies one or more characteristics of the data value; and accumulating statistical information based on a value of the data tag.

42. The method of claim 41, further comprising:

displaying a graph that includes a point that represents the data value.

43. A measurement and testing instrument (MTI) comprising:

an analog to digital converter that is configured to convert an analog signal into a digital form that includes at least one digital data value that measures a characteristic of the analog signal; and logic that is configured to associate a data tag with the data value, wherein the data tag identifies one or more characteristics of the data value;

wherein the MTI is a member of a group consisting of:
an oscilloscope, a spectrum analyzer, a logic analyzer, a vector analyzer, a network analyzer, and a time interval analyzer.

44. The MTI of claim 43, further comprising:

memory that is configured to store the data value.

45. The MTI of claim 44, further comprising:

a display screen, wherein the MTI is configured to display via the display screen a point that corresponds to the data value.

46. The MTI of claim 43, further comprising:

a display screen, wherein the MTI is configured to display via the display screen a point that corresponds to the data value.

47. A measurement and testing instrument (MTI) comprising:

an analog to digital converter that is configured to convert an analog signal into a digital form that includes at least one digital data value that measures a characteristic of the analog signal;

logic that is configured to associate a data tag with the data value, wherein the data tag identifies one or more characteristics of the data value; and a display screen that is configured to display a point that corresponds to the data value.

48. The MTI of claim 47, wherein the MTI is a member of a group consisting of:

an oscilloscope, a spectrum analyzer, a logic analyzer, a vector analyzer, a network analyzer, and a time interval analyzer.

49. A measurement and testing instrument (MTI) comprising:

an analog to digital converter that is configured to convert an analog signal into a digital form that includes at least one digital data value that measures a characteristic of the analog signal;

logic that is configured to associate a data tag with the data value, wherein the data tag identifies one or more characteristics of the data value; and a data splitting module that is configured to route the data value based on a value of the data tag.

50. The MTI of claim 49, wherein the MTI is a member of a group consisting of:

an oscilloscope, a spectrum analyzer, a logic analyzer, a vector analyzer, a network analyzer, and a time interval analyzer.

51. A measurement and testing instrument (MTI) comprising:

an analog to digital converter that is configured to convert an analog signal into a digital form that includes at least one digital data value that measures a characteristic of the analog signal;

logic that is configured to associate a data tag with the data value, wherein the data tag identifies one or more characteristics of the data value; and a data reduction module that is configured to decimate a plurality of data values that include the data value.

52. The MTI of claim 51, further comprising:

a display screen, wherein the MTI is configured to display via the display screen a point that corresponds to the data value.

* * * * *